(12) United States Patent
Choi et al.

(10) Patent No.: US 9,391,131 B2
(45) Date of Patent: Jul. 12, 2016

(54) ORGANIC LIGHT EMITTING DISPLAY DEVICE AND METHOD OF MANUFACTURING THE SAME

(71) Applicant: LG Display Co., Ltd., Seoul (KR)

(72) Inventors: Hee Dong Choi, Seosan-si (KR); Sung Jin Hong, Goyang-si (KR); Soon Il Yun, Paju-si (KR); Il Gi Jeong, Cheongwon-gun (KR); Joong Sun Yoon, Goyang-si (KR); Kyungsu Lee, Seoul (KR); Seung-Yong Yang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/047,327

(22) Filed: Feb. 18, 2016

(65) Prior Publication Data
US 2016/0164050 A1 Jun. 9, 2016

Related U.S. Application Data

(62) Division of application No. 14/534,387, filed on Nov. 6, 2014, now Pat. No. 9,281,352.

(30) Foreign Application Priority Data

Nov. 6, 2013 (KR) ........................ 10-2013-0134429

(51) Int. Cl.
H01L 27/32 (2006.01)

(52) U.S. Cl.
CPC .................................. *H01L 27/3272* (2013.01)

(58) Field of Classification Search
None
See application file for complete search history.

(56) References Cited

U.S. PATENT DOCUMENTS

| | | | |
|---|---|---|---|
| 9,281,352 B2 * | 3/2016 | Choi | .................... H01L 27/3272 |
| 2011/0170045 A1 | 7/2011 | Lee et al. | |
| 2011/0205249 A1 | 8/2011 | Yoshida et al. | |
| 2015/0123107 A1 * | 5/2015 | Choi | .................... H01L 27/3272 257/40 |

* cited by examiner

*Primary Examiner* — Seahvosh Nikmanesh
(74) *Attorney, Agent, or Firm* — Morgan, Lewis & Bockius LLP

(57) ABSTRACT

Provided are an organic light emitting display device and a method of manufacturing the same. The organic light emitting display device includes: an emission unit including an organic light emitting diode, a pixel circuit unit including: a circuit configured to drive the emission unit, and a line configured to apply a signal to the circuit, and a light blocking layer covering the pixel circuit unit, and configured to block light input to the pixel circuit unit, and a repair part disposed in the light blocking layer, the repair part being configured for repairing the line when a defect occurs in a pixel that includes the pixel circuit unit.

10 Claims, 6 Drawing Sheets

ORGANIC LIGHT EMITTING DISPLAY DEVICE AND METHOD OF MANUFACTURING THE SAME

CROSS-REFERENCE TO RELATED APPLICATION(S)

The present application is a divisional of U.S. patent application Ser. No. 14/534,387, filed on Nov. 6, 2014, which claims benefit and priority under 35 U.S.C. §119(a) of Korean Patent Application No. 10-2013-0134429, filed on Nov. 6, 2013, the entire disclosure of each of which is hereby incorporated by reference herein for all purposes.

BACKGROUND

1. Technical Field

The following description relates to an organic light emitting display device and method of manufacturing the same, and more particularly, to an organic light emitting display device for preventing short circuit which occurs in a repair process of a defective pixel formed in a panel.

2. Discussion of the Related Art

In recent years, in the advent of the information-oriented society, importance of flat panel display devices is increasing because of good characteristics in thinness and light weight thereof and the realization of low power consumption. In the flat panel display devices, liquid crystal display (LCD) devices including a thin film transistor (TFT) have good resolution, color display, and image quality, and thus are commercialized as display devices for notebook computers, tablet computers, and desktop computers. In particular, organic light emitting display (OLED) devices are self-emitting devices, and have a fast response time, low power consumption, high emission efficiency, and a wide viewing angle. Therefore, organic light emitting display devices are attracting a lot of attention as next-generation flat panel display devices.

Hereinafter, a related art organic light emitting display device will be described with reference to the drawing.

FIG. 1 is a schematic diagram illustrating a related art organic light emitting display device.

With reference to FIG. 1, the related art organic light emitting display device includes an emission unit OA including an organic light emitting diode OLED, a circuit for driving the emission unit, and a pixel circuit unit CA that includes a line for applying a signal to the circuit.

The pixel circuit unit CA includes a first switching transistor ST1, a second switching transistor ST2, a driving transistor DT, and a capacitor Cst.

The pixel circuit unit CA includes a data line DL through which a data voltage $V_{data}$ is supplied to the first switching transistor ST1, a gate line GL through which a scan signal Scan is supplied, a power line PL through which a first driving voltage $V_{dd}$ is supplied to the driving transistor DT, a sensing signal line SL through which a sense signal Sense is supplied to the second switching transistor ST2, and a reference voltage line RL through which a reference voltage $V_{ref}$ is supplied. The first switching transistor ST1 includes a gate electrode connected to the gate line GL, a source electrode connected to the data line DL, and a drain electrode that is connected to a gate electrode of the driving transistor DT and a first node N1. The second switching transistor ST2 includes a gate electrode connected to the sensing signal line SL, a source electrode connected to the reference voltage line RL, and a drain electrode connected to a second node N2, which is connected to the driving transistor DT and the organic light emitting diode OLED.

The organic light emitting diode OLED included in the emission unit OA is electrically connected between a source of the driving transistor DT and a cathode voltage $V_{ss}$ terminal. The organic light emitting diode OLED emits light with a data current $I_{oled}$ supplied from the driving transistor DT.

In this case, the pixel circuit unit CA includes a light blocking layer 20 which is formed for preventing external light from being input to the first switching transistor ST1, the second switching transistor ST2, and the driving transistor DT.

In the related art organic light emitting display device, when a pixel defect occurs in the pixel circuit unit CA, a repair process is performed for solving the pixel defect. The repair process is a process that uses laser light to recover a pixel defect in a substrate.

However, in the related art organic light emitting display device, because the light blocking layer 20 is formed all over the pixel circuit unit CA, it is difficult to find a repair area in which a pixel defect occurs.

Moreover, when removing the light blocking layer 20 (which is formed in the repair area) with the laser to perform the repair process, a secondary short circuit occurs between the light blocking layer 20 and a metal layer of a transistor.

SUMMARY

Accordingly, embodiments of the present application are directed to an organic light emitting display device and method of manufacturing the same that substantially obviate one or more problems due to the limitations and disadvantages of the related art.

An object of embodiments is to provide an organic light emitting display device that enables a repair area (where a pixel defect occurs in a pixel circuit unit) to be easily found, and to prevent a secondary short circuit from occurring between a light blocking layer and a metal layer of a transistor during a repair process.

Advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose according to one aspect of the invention, there is provided an organic light emitting display device, including: an emission unit including an organic light emitting diode, a pixel circuit unit including: a circuit configured to drive the emission unit, and a line configured to apply a signal to the circuit, and a light blocking layer covering the pixel circuit unit, and configured to block light input to the pixel circuit unit, and a repair part disposed in the light blocking layer, the repair part being configured for repairing the line when a defect occurs in a pixel that includes the pixel circuit unit.

In another aspect, there is provided a method of manufacturing an organic light emitting display device, the method including: providing an emission unit including an organic light emitting diode, providing a pixel circuit unit including: a circuit configured to drive the emission unit, and a line configured to apply a signal to the circuit, and providing a light blocking layer covering the pixel circuit unit, and configured to block light input to the pixel circuit unit, and providing a repair part disposed in the light blocking layer, the repair part being configured for repairing the line when a defect occurs in a pixel that includes the pixel circuit unit.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are examples and explanatory and are intended to provide further explanation of the disclosure as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the invention.

Figure 1:
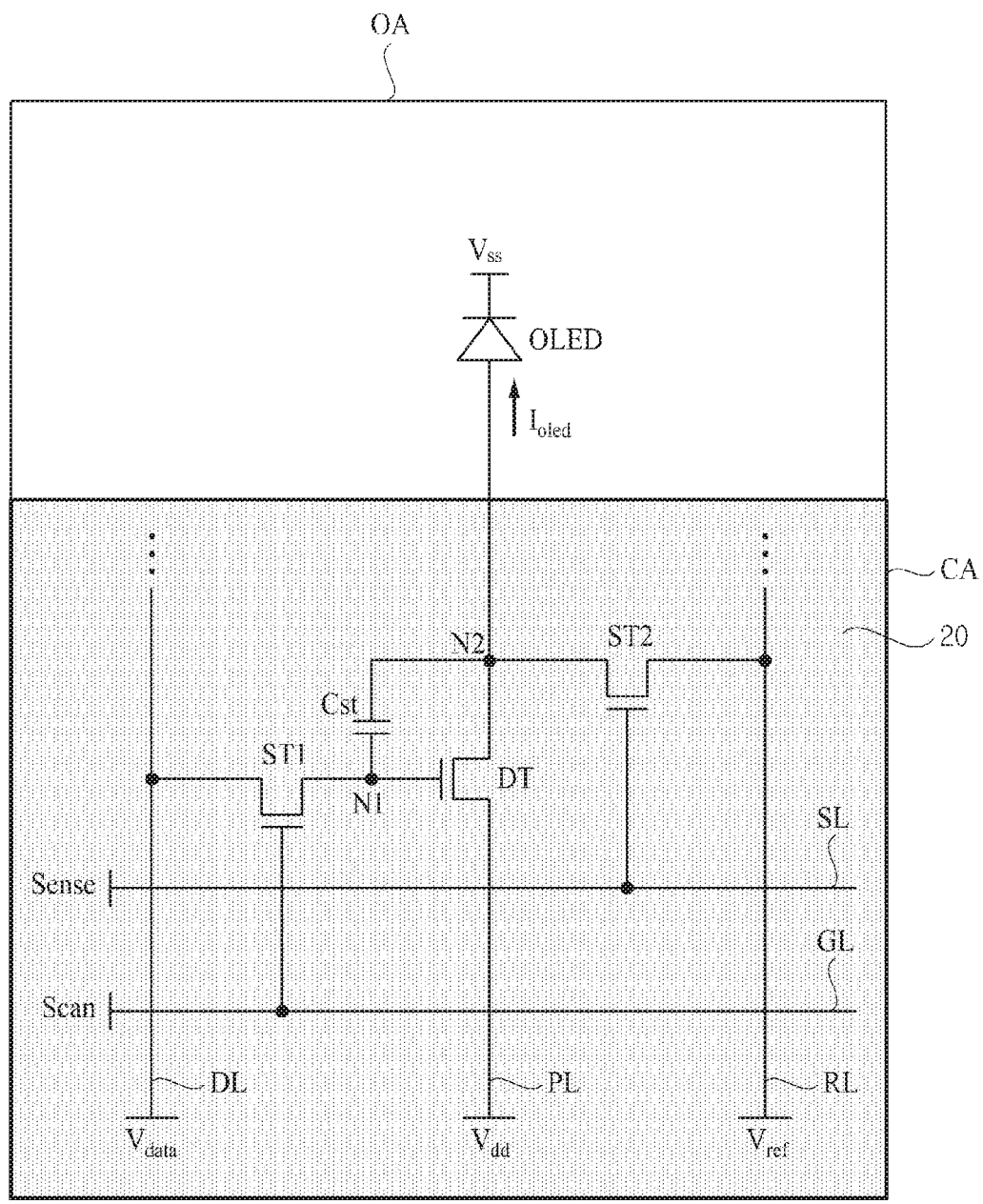
FIG. 1 is a schematic diagram illustrating a related art organic light emitting display device.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present invention, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Hereinafter, embodiments will be described in detail with reference to the accompanying drawings.

Figure 2:
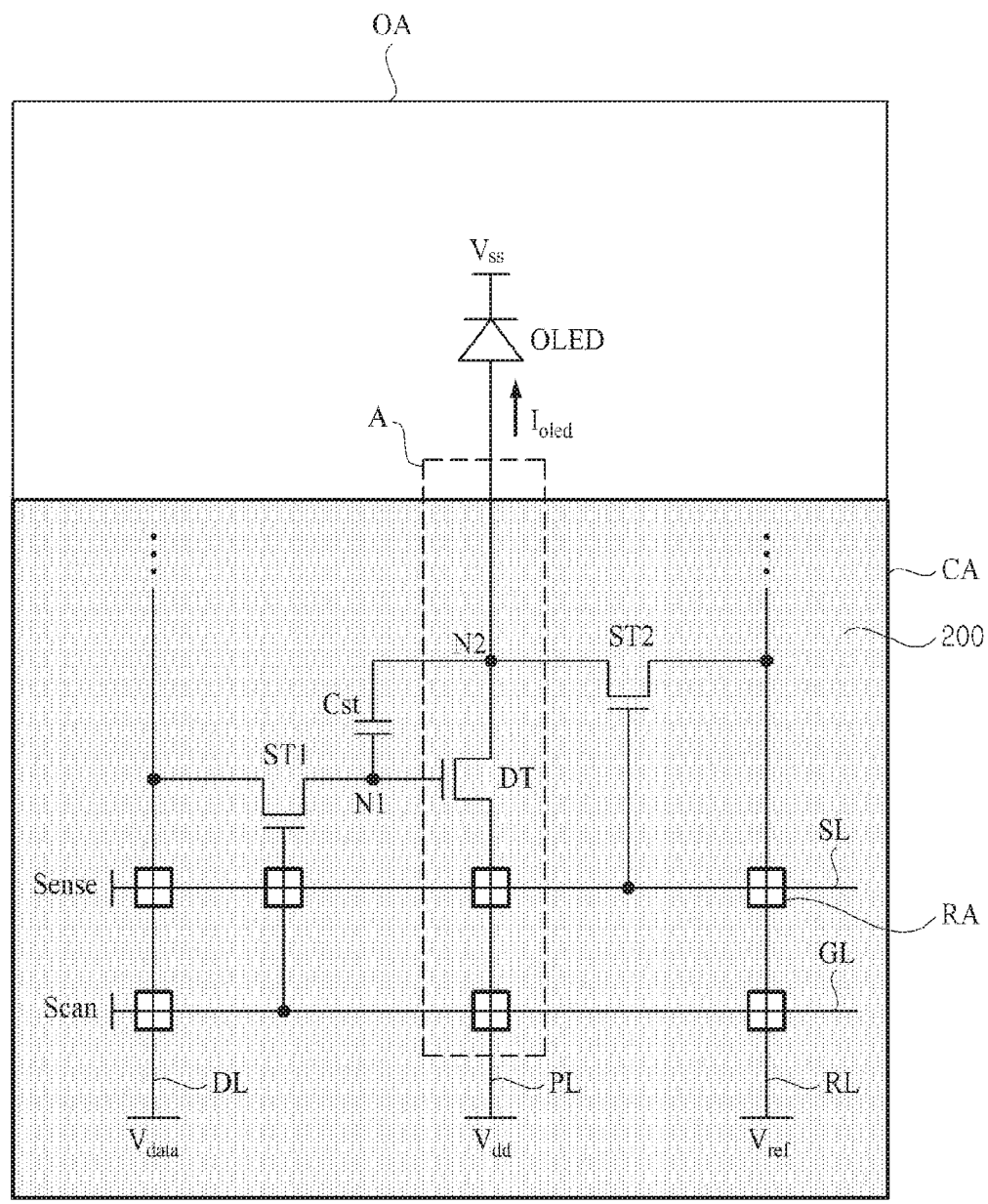
FIG. 2 is a schematic diagram illustrating an organic light emitting display device according to an embodiment.

FIG. 2 is a schematic diagram illustrating an organic light emitting display device according to an embodiment.

As seen in the example of FIG. 2, the organic light emitting display device according to an embodiment may include an emission unit OA, including an organic light emitting diode OLED, and a pixel circuit unit CA that may include a circuit for driving the emission unit and a line for applying a signal to the circuit. In one example, the pixel circuit unit CA may include a first switching transistor ST1, a second switching transistor ST2, a driving transistor DT, and a capacitor Cst.

The line may include at least one of a gate line GL, a sensing signal line SL, a data line DL, a driving power line PL, and a reference voltage line RL. The line may include a first line which may be arranged in a first direction (for example, a horizontal direction).

The gate line GL and the sensing signal line SL may correspond to the first line. The gate line GL and the sensing signal line SL may be formed in parallel in the first direction (for example, the horizontal direction). In one example, a scan signal (e.g., a gate driving signal) may be applied from a gate driver (not shown) to the gate line GL, and a sensing signal may be applied to the sensing signal line SL.

The data line DL may be formed in a second direction (for example, a vertical direction) to intersect the gate line GL and the sensing signal line SL. In one example, a data voltage $V_{data}$ may be supplied from a data driver (not shown) to the data line DL. The reference voltage line RL may be formed in parallel with the data line DL, and a reference voltage $V_{ref}$ may be supplied to the reference voltage line RL. The driving power line PL may be formed in parallel with the data line DL, and a first driving voltage $V_{dd}$ may be supplied to the driving power line PL.

Each of the first switching transistor ST1, the second switching transistor ST2, and the driving transistor DT may be, for example, an N-type transistor, and may be, for example, an amorphous silicon (a-Si) transistor, a polysilicon (poly-Si) transistor, an oxide transistor, or an organic transistor. However, embodiments are not limited thereto. For example, each of the transistors ST1, ST2, and DT may be formed of a P-type transistor. The materials may be altered, as well, as understood by one of ordinary skill in the art.

The first switching transistor ST1 may include a gate electrode connected to the gate line GL, a source electrode (e.g., a first electrode) connected to the data line DL, and a drain electrode (e.g., a second electrode) that may be connected to a gate electrode of the driving transistor DT and a first node N1. The first switching transistor ST1 may be turned on according to the scan signal having a gate-on voltage level supplied to the gate line GL, and may supply the data voltage $V_{data}$, supplied through the data line DL, to a first node N1, e.g., a gate electrode of the driving transistor DT.

The second switching transistor ST2 may include a gate electrode connected to the sensing signal line SL, a source electrode (e.g., a first electrode) connected to the reference voltage line RL, and a drain electrode (e.g., a second electrode) connected to a second node N2 connected to the driving transistor DT and the organic light emitting diode OLED. The second switching transistor ST2 may be turned on according to the sensing signal having the gate-on voltage level supplied to the sensing signal line SL, and may supply the reference voltage $V_{ref}$, supplied through the reference voltage line RL, to a drain electrode of the driving transistor DT.

The capacitor Cst may be connected between a gate electrode and the drain electrode of the driving transistor DT, e.g., the first and second nodes N1 and N2. The capacitor Cst may be charged with a difference voltage between a voltage supplied to the first node N1 and a voltage supplied to the second node N2, and the driving transistor DT may be turned on with the charged voltage.

The driving transistor DT may include the gate electrode which may be connected in common to the drain electrode of the first switching transistor ST1 and a first electrode of the capacitor Cst. The driving transistor DT may include a source electrode connected to the driving power line PL. Also, the driving transistor DT may include the drain electrode which may be connected in common to the drain electrode of the second switching transistor ST2, a second electrode of the capacitor Cst, and an anode electrode of the organic light emitting diode OLED. The driving transistor DT may be turned on with a voltage of the capacitor Cst at every emission period, and may control an amount of current flowing from a first driving voltage $V_{dd}$ terminal to the organic light emitting diode OLED.

The organic light emitting diode OLED may emit light with a data current $I_{oled}$ supplied from the driving transistor DT to emit single-color light having luminance corresponding to the data current $I_{oled}$. The organic light emitting diode OLED may include an anode electrode (not shown) connected to the second node N2, an organic layer (not shown) formed on the anode electrode, and a cathode electrode (not shown) formed on the organic layer.

The organic layer may be formed to have a structure of a hole transport layer/organic emission layer/electron transport layer or a structure of a hole injection layer/hole transport layer/organic emission layer/electron transport layer/electron injection layer. In addition, the organic layer may further include a function layer for enhancing the emission efficiency and/or service life of the organic emission layer. In one example, a second driving voltage $V_{ss}$ may be supplied to a cathode electrode of the organic light emitting diode OLED through a second driving power line (not shown) which may be formed as a line type.

In one embodiment, a light blocking layer 200 for blocking light input to the pixel circuit unit CA may be formed in the pixel circuit unit CA. That is, the light blocking layer 200 may cover the pixel circuit unit CA. The light blocking layer 200 may include a repair part RA for repairing a line, e.g., at least one of the gate line GL, the sensing signal line SL, the data line DL, the driving power line PL, and the reference voltage line RL.

The repair part RA may overlap the line such that the line may be open. That is, the light blocking layer 200 may not be formed in the repair part RA, and thus, a second short circuit between the light blocking layer 200 and a metal layer of a transistor may be prevented from forming during a repair process.

The repair part RA according to an embodiment may be provided in an area where a first line intersects a second line. That is, the line may include the first line, which may be arranged in the first direction, and the second line which may be arranged in the second direction different from the first direction. For example, the first line may include one or more of the gate line GL and the sensing signal line SL, and the second line may include one or more of the data line DL, the reference voltage line RL, and the driving power line PL.

Figure 3:
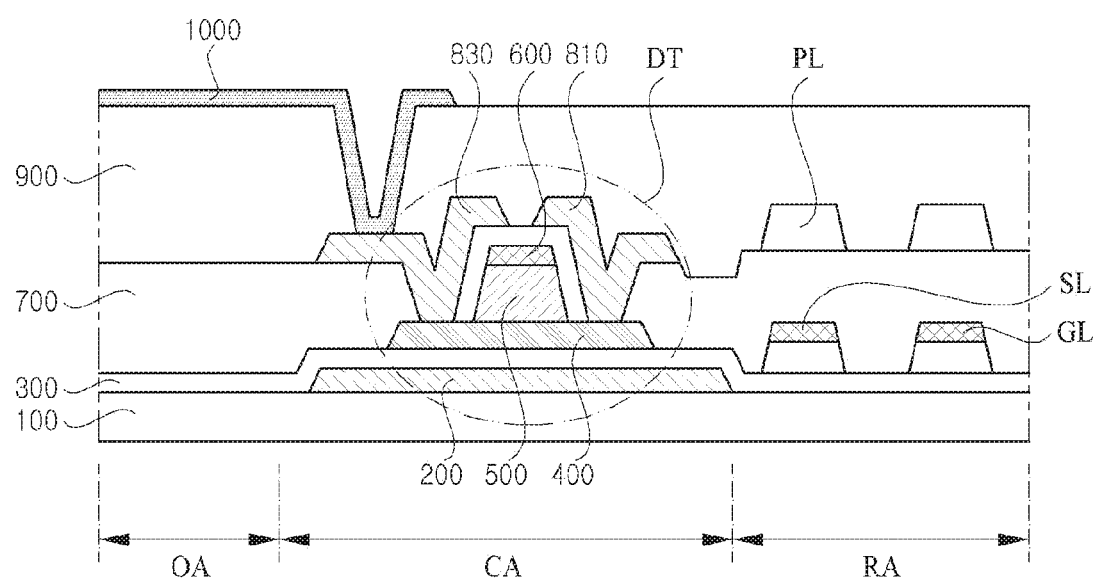
FIG. 3 is a cross-sectional view illustrating a portion A of FIG. 2.

FIG. 3 is a cross-sectional view illustrating a portion A of FIG. 2.

As seen in the FIG. 3 example, a substrate 100 may include the emission unit OA, the pixel circuit unit CA, and the repair part RA. The substrate 100 may be formed of a transparent insulating substrate formed, e.g., of glass, quartz, ceramic, or plastic. However, embodiments are not limited thereto. For example, when the substrate 100 is formed of plastic, the substrate 100 may be formed of a flexible substrate. The light blocking layer 200 may be formed in a pattern on the substrate 100 including the pixel circuit unit CA.

The repair part RA may correspond to an area in which the first line intersects the second line. In one example, the first line may include one or more of the gate line GL and the sensing signal line SL, and the second line may include one or more of the data line DL, the reference voltage line RL, and the driving power line PL.

The light blocking layer 200 may prevent external light from being input to or interfering with a transistor. The light blocking layer 110 may be formed of one of amorphous silicon and amorphous germanium, and may be formed of a light-blocking material, without being limited thereto. In one example, the light blocking layer 200 may not be formed in the repair part RA. This may prevent a secondary short circuit which may occur between the first and second lines when repairing a pixel defect. In more detail, when a short circuit forms between the gate line GL and the first driving voltage line PL and a short circuit forms between the sensing signal line SL and the first driving voltage line PL, a pixel defect can occur in the repair part RA where the first line intersects the second line.

A buffer layer 300 may be formed all over the light blocking layer 200 and the substrate 100. The buffer layer 300 may be formed of a light-transmitting insulating material, such as silicon oxide or silicon nitride, although embodiments are not limited thereto. The buffer layer 300 may prevent diffusion and penetration of water or impurities from occurring in the substrate 100, and may planarize a surface.

An active layer 400 may be formed in a pattern on the substrate 100 including the pixel circuit part CA. The active layer 400 may be formed of an oxide semiconductor such as In—Ga—Zn—O (IGZO), but is not limited thereto.

In one example, when light is incident on the active layer 400, a threshold voltage shift may occurs, causing a degradation in reliability of a device. In particular, when the active layer 400 is formed of an oxide semiconductor, the threshold voltage shift may become severe. To prevent such a problem, the light blocking layer 200 for blocking light may be formed under the active layer 400.

A gate insulating layer 500 may be formed in a pattern on the substrate 100. The gate insulating layer 500 may be formed of an inorganic-based insulating material such as silicon oxide or silicon nitride. However, embodiments are not limited thereto. The gate insulating layer 500 may be formed of an organic-based insulating material such as photo acryl or benzocyclobutene (BCB). Other materials are also included in embodiments.

A gate electrode 600 may be formed on the gate insulating layer 500 of the pixel circuit unit CA, and the gate line GL may be formed on the gate insulating layer 500 of the repair part RA. Each of the gate electrode 600, the sensing signal line SL, and the gate line GL may be formed of molybdenum (Mo), aluminum (Al), chromium (Cr), gold (Au), titanium (Ti), nickel (Ni), neodymium (Nd), copper (Cu), or an alloy thereof, and may be formed of a single layer or double or more multi-layer of the metal and alloy. It should be appreciated that embodiments are not limited to these materials.

An inter-layer dielectric 700 may include a contact hole which may expose both ends of the active layer 400, and may be formed in a pattern on the substrate 100. The inter-layer dielectric 700 may be formed of an inorganic-based insulating material such as silicon oxide or silicon nitride, but is not limited thereto.

First and second electrodes 810 and 830 may be formed on the inter-layer dielectric 700 in a transistor area, and may face each other. The first electrode 810 may be a source electrode, and the second electrode 830 may be a drain electrode, although these may be switched as understood by one of ordinary skill in the art, for example, depending on the transistor type and application. The first and second electrodes 810 and 830 may be connected to the active layer 400 through the contact hole.

Each of the first and second electrodes 810 and 830 may be formed of molybdenum (Mo), aluminum (Al), chromium (Cr), gold (Au), titanium (Ti), nickel (Ni), neodymium (Nd), copper (Cu), or an alloy thereof, and may be formed of a single layer or double or more multi-layer of the metal and alloy. The materials are not limited thereto.

The driving power line PL may be formed on the inter-layer dielectric 700 of the repair part RA. The driving power line PL may vertically intersect the gate line GL and the sensing signal line SL, and the repair part RA may be provided at a portion where the driving power line PL intersects the gate line GL and the sensing signal line SL.

A protective layer 900 may be formed on the substrate 100, and may include a contact hole which exposes the second electrode 830. The protective layer 900 may be formed of an acryl-based compound, although embodiments are not limited thereto.

An anode electrode 1000 may be formed in a pattern on the protective layer 900. The anode electrode 1000 may be electrically connected to the second electrode 830 through the contact hole. In one example, the anode electrode 1000 may be formed of transparent metal such as indium-tin-oxide (ITO) or indium-zinc-oxide (IZO), although embodiments are not limited thereto.

Figure 4:
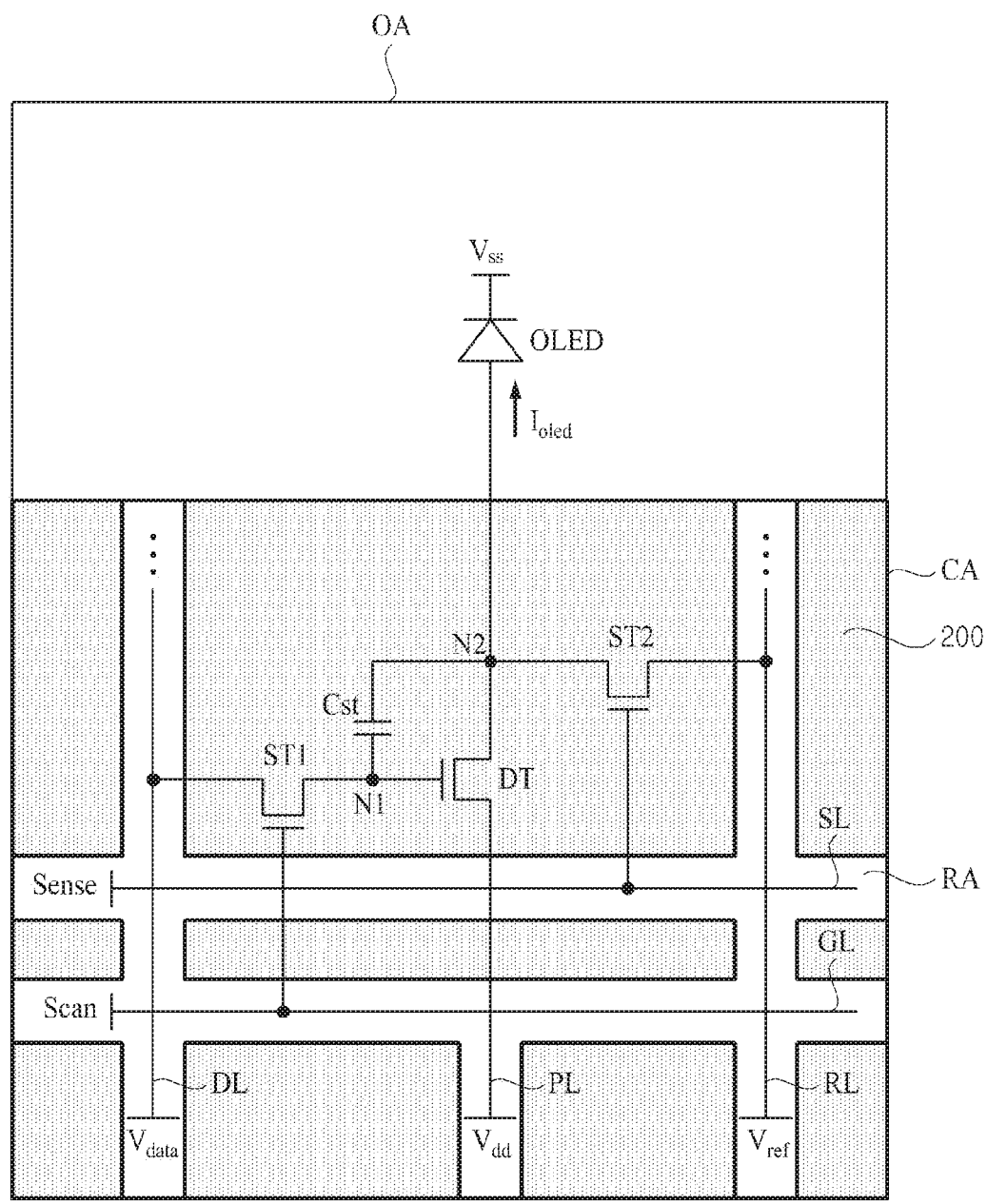
FIG. 4 is a schematic diagram illustrating an organic light emitting display device according to an embodiment.

FIG. 4 is a schematic diagram illustrating an organic light emitting display device according to an embodiment. Except that a repair part RA is changed, the organic light emitting display device of the FIG. 4 example is substantially similar to the organic light emitting display device of the FIG. 2 example. Thus, like reference numerals refer to like elements, and descriptions of similar elements are not repeated.

As seen in the FIG. 4 example, the organic light emitting display device according to an embodiment may include an emission unit OA, including an organic light emitting diode OLED, and a pixel circuit unit CA that may include a circuit for driving the emission unit OA and a line for applying a signal to the circuit.

In one example, a light blocking layer 200 for blocking light input to the pixel circuit unit CA may be formed in the pixel circuit unit CA, and may include a repair part RA which may overlap the line such that the line may be open. That is, the light blocking layer 200 may cover the pixel circuit unit CA. The repair part RA may be formed in the light blocking layer 200 to expose the line.

The line may include a first line which may be arranged in a first direction, and the repair part RA according to an embodiment may be formed to extend along the first line in correspondence with the first line. The repair part RA may be formed to be open along the line, e.g., a gate line GL, a sensing signal line SL, a data line DL, a reference voltage line RL, and a driving power line PL.

Therefore, the light blocking layer 200 in which the repair part RA is formed may block light input to a first switching transistor ST1, a second switching transistor ST2, and a driving transistor DT, and may prevent signal distortion from occurring between the light blocking layer 200 and the line.

Figure 5:
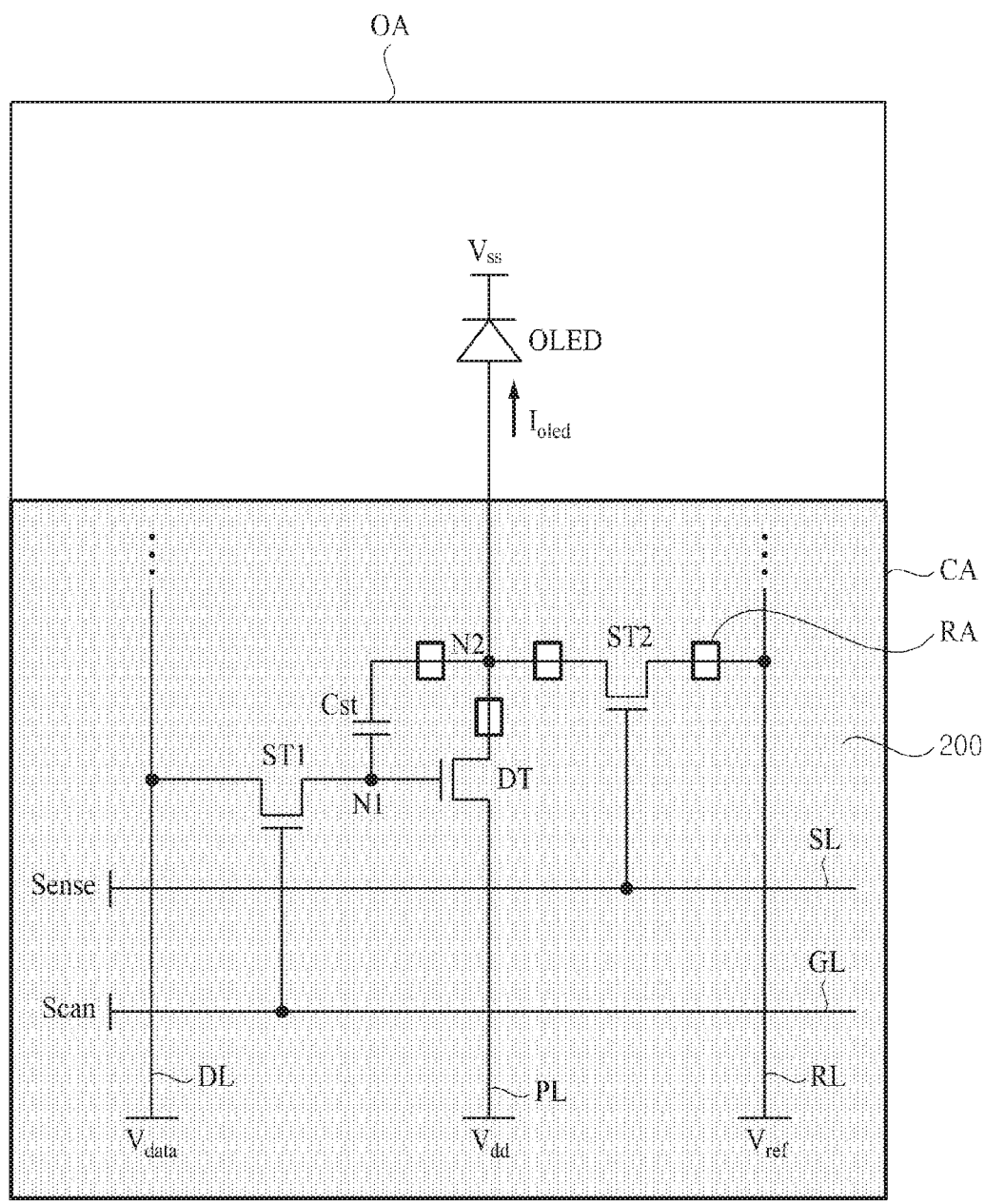
FIG. 5 is a schematic diagram illustrating an organic light emitting display device according to an embodiment.

FIG. 5 is a schematic diagram illustrating an organic light emitting display device according to an embodiment. Except that a repair part RA is changed, the organic light emitting display device of FIG. 5 is substantially similar to the organic light emitting display device of FIG. 2. Thus, like reference numerals refer to like elements, and descriptions on similar elements are not repeated.

As seen in the FIG. 5 example, the organic light emitting display device according to an embodiment may include an emission unit OA, including an organic light emitting diode OLED, and a pixel circuit unit CA that may include a circuit for driving the emission unit OA and a line for applying a signal to the circuit.

In one example, a light blocking layer 200 for blocking light input to the pixel circuit unit CA may be formed in the pixel circuit unit CA, and may include a repair part RA which may overlap the line such the line may be open. That is, the light blocking layer 200 may cover the pixel circuit unit CA.

The circuit may include a capacitor Cst, a first switching transistor ST1, a second switching transistor ST2, and a driving transistor DT. The repair part RA according to an embodiment may be formed to provide an opening over at least one of a line between the capacitor Cst and the second switching transistor ST2, a line between the capacitor Cst and the driving transistor DT, a line between the driving transistor DT and the second switching transistor ST2, and a line connected to the second switching transistor ST2.

According to an embodiment, external light input to a transistor may be blocked by the light blocking layer 200. Also, a light transmittance may be secured by using the repair part RA that may be an area in which the light blocking layer 200 is open. Therefore, a manufacturer that manufactures the organic light emitting display device according to an embodiment may determine and repair a repair area in which a pixel defect occurs, which may enhance a yield rate and quality of the organic light emitting display device.

Figure 6:
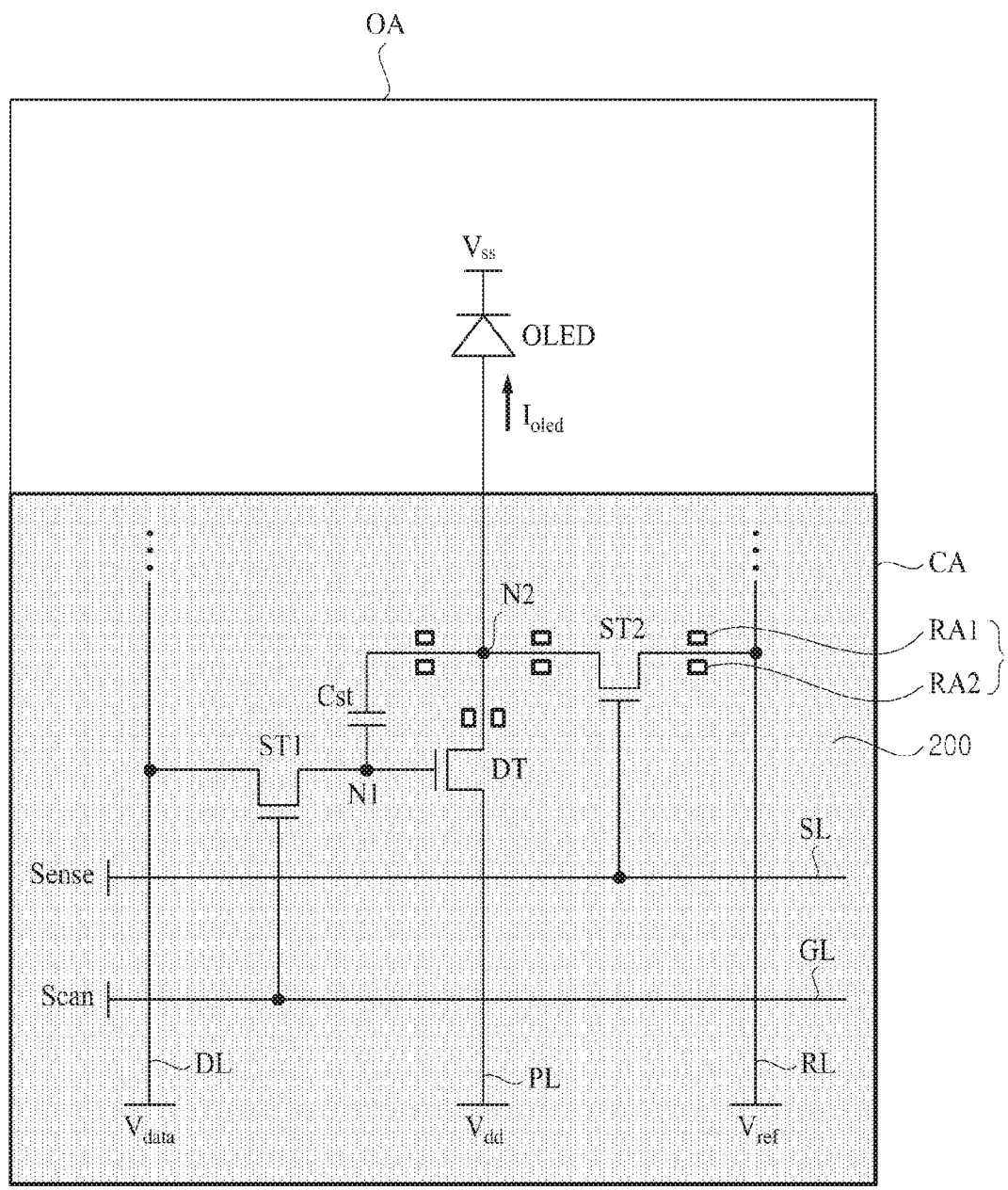
FIG. 6 is a schematic diagram illustrating an organic light emitting display device according to an embodiment.

FIG. 6 is a schematic diagram illustrating an organic light emitting display device according to an embodiment. Except that a repair part RA is changed, the organic light emitting display device of FIG. 6 is substantially similar to the organic light emitting display device of FIG. 2. Thus, like reference numerals refer to like elements, and descriptions on similar elements are not repeated.

As seen in the FIG. 6 example, the organic light emitting display device according to an embodiment may include an emission unit OA, including an organic light emitting diode OLED, and a pixel circuit unit CA that may include a circuit for driving the emission unit OA and a line for applying a signal to the circuit.

In one example, a light blocking layer 200 for blocking light input to the pixel circuit unit CA may be formed in the pixel circuit unit CA, and may includes a repair part RA including first and second repair parts RA1 and RA2 which may be respectively formed at each side of the line without overlapping the line. The circuit may include a capacitor Cst, a first switching transistor ST1, a second switching transistor ST2, and a driving transistor DT.

The repair part RA according to an embodiment may be formed to be open over at least one of a line between the capacitor Cst and the second switching transistor ST2, a line between the capacitor Cst and the driving transistor DT, a line between the driving transistor DT and the second switching transistor ST2, and a line connected to the second switching transistor ST2.

The first and second repair parts RA1 and RA2 may not overlap the line, and the light blocking layer 200 may not be formed at the sides of the line. Accordingly, the sides of the line may be open. According to an embodiment, when a pixel defect occurs, a manufacturer may cut the first and second repair parts RA1 and RA2, e.g., with a laser, and the first and second repair parts RA1 and RA2 may be repaired through the openings by the line. Moreover, according to an embodiment, external light input to a transistor may be blocked by the light blocking layer 200, and a repair area in which a pixel defect occurs may be detected.

While the pixel circuit unit CA has been described above as having a 3T1C (three transistor, one capacitor) structure which includes the first switching transistor ST1, the second switching transistor ST2, the driving transistor DT, and the capacitor Cst, embodiments are not limited thererto. For example, the pixel circuit unit CA may have a 2T1C (two transistor, one capacitor) structure. In this case, the repair part RA provided on a line connected to the second switching transistor ST2 may not be provided.

As described above, the light blocking layer including the repair part for repairing a line when a pixel defect of the pixel circuit unit occurs may be provided, which may prevent a secondary short circuit from occurring between the light blocking layer and a metal layer of a transistor in the repair process. Moreover, by providing the light blocking layer including the repair part, external light may be prevented from being input to or interfering with a transistor in the repair process, and a pixel defect may be detected, which may enhance a yield rate and quality of the organic light emitting display device.

Moreover, by providing the light blocking layer including the repair part, signal distortion may be prevented between the light blocking layer and a line. Also, the first and second repair parts may be respectively provided at one side and the other side (both sides) of a line such that they may not overlap the line, and thus, external light may be prevented from being input to a transistor as much as possible, which may assist in finding a repair area.

It will be apparent to those skilled in the art that various modifications and variations can be made in the present invention without departing from the spirit or scope of the inventions. Thus, it is intended that embodiments of the present invention cover the modifications and variations of this invention provided they come within the scope of the appended claims and their equivalents.

What is claimed is:

1. A method of manufacturing an organic light emitting display device, the method comprising:
   providing an emission unit comprising an organic light emitting diode;
   providing a pixel circuit unit comprising:
      a circuit configured to drive the emission unit; and
      a line configured to apply a signal to the circuit; and
   providing a light blocking layer covering the pixel circuit unit, and configured to block light input to the pixel circuit unit; and
   providing a repair part disposed in the light blocking layer, the repair part being configured for repairing the line when a defect occurs in a pixel that includes the pixel circuit unit.

2. The method of claim 1, wherein the repair part overlaps the line, such that light blocking layer comprises an opening over the line.

3. The method of claim 2, wherein:
   providing the line comprises:
      providing a first line arranged in a first direction; and
      providing a second line arranged in a second direction different from the first line, and
   the repair part is provided in an area where the first line intersects the second line.

4. The method of claim 2, wherein:
   providing the line comprises providing a first line arranged in a first direction; and
   the repair part extends along the first line in correspondence with the first line.

5. The method of claim 2, wherein:
   providing the circuit comprises:
      providing a capacitor;
      providing a switching transistor; and
      providing a driving transistor; and
   the repair part is provided to form an opening over at least one of: a line between the capacitor and the switching transistor, a line between the capacitor and the driving transistor, a line between the driving transistor and the switching transistor, and a line connected to the switching transistor.

6. The method of claim 1, wherein providing the repair part comprises providing first and second repair parts respectively at one side and another side of the line, without overlapping the line.

7. The method of claim 6, wherein:
   providing the circuit comprises:
      providing a capacitor;
      providing a switching transistor; and
      providing a driving transistor; and
   the repair part is provided to form an opening at one side and the another side of at least one of: a line between the capacitor and the switching transistor, a line between the capacitor and the driving transistor, a line between the driving transistor and the switching transistor, and a line connected to the switching transistor.

8. The method of claim 6, wherein the light blocking layer is not formed in the first and second repair parts.

9. The method of claim 1, wherein providing the line comprises providing at least one of: a gate line, a data line, a driving power line, a sensing signal line, and a reference voltage line.

10. The method of claim 1, wherein the light blocking layer comprises one or more of: amorphous silicon or amorphous germanium.

* * * * *